United States Patent
Mania et al.

(10) Patent No.: US 7,360,586 B2
(45) Date of Patent: Apr. 22, 2008

(54) WRAP AROUND HEAT SINK APPARATUS AND METHOD

(75) Inventors: Michael John Mania, Wayne, NJ (US); Brian Patrick O'Donnell, New Windsor, NY (US); Laurence Fox, Nanuet, NY (US); Albert Pedoeem, West Orange, NJ (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/630,689

(22) Filed: Jul. 31, 2003

(65) Prior Publication Data

US 2005/0022970 A1 Feb. 3, 2005

(51) Int. Cl.
*H05K 7/20* (2006.01)

(52) U.S. Cl. ............... 165/185; 165/80.3; 165/67; 361/697; 361/707; 361/709; 257/707; 257/718; 257/719; 257/726; 257/727

(58) Field of Classification Search ............ 165/80.3, 165/185, 67; 361/697, 707, 709, 711, 712, 361/713, 714, 715, 716, 717; 257/707, 718, 257/719, 726, 727
See application file for complete search history.

(56) References Cited

U.S. PATENT DOCUMENTS

| 2,888,228 | A | * | 5/1959 | Jarvis | 248/316.6 |
|---|---|---|---|---|---|
| 3,047,648 | A | * | 7/1962 | Mowatt | 257/718 |
| 3,548,927 | A | * | 12/1970 | Spurling | 165/80.3 |
| 3,859,570 | A | * | 1/1975 | Veranth et al. | 257/718 |
| 4,206,488 | A | * | 6/1980 | Nakayama et al. | 360/96.1 |
| 4,552,206 | A | * | 11/1985 | Johnson et al. | 165/80.3 |
| 4,605,058 | A | * | 8/1986 | Wilens | 257/718 |
| 4,712,159 | A | * | 12/1987 | Clemens | 361/717 |
| 4,878,108 | A | * | 10/1989 | Phelps et al. | 257/718 |
| 4,978,638 | A | * | 12/1990 | Buller et al. | 29/825 |
| 5,329,426 | A | * | 7/1994 | Villani | 361/719 |
| 5,603,374 | A | * | 2/1997 | Wu | 165/80.3 |
| 6,590,772 | B1 | * | 7/2003 | Ju | 361/704 |
| 6,633,485 | B1 | * | 10/2003 | Sigl et al. | 361/718 |

* cited by examiner

*Primary Examiner*—John K. Ford
(74) *Attorney, Agent, or Firm*—Bingham McCutchen LLP

(57) ABSTRACT

A mounting plate that is secured between a substrate and a component is used to mount a heat sink. The plate includes holes to accommodate the leads of the component and mounting flanges that partially surround the component and are used to mount the heat sink. In the mounted position, the heat sink is held in thermal communication with the component directly or through a thermally conductive material.

11 Claims, 3 Drawing Sheets

US 7,360,586 B2

WRAP AROUND HEAT SINK APPARATUS AND METHOD

FIELD OF THE INVENTION

The present invention relates generally to heat dissipation and, more particularly, to a heat sink apparatus and method for easy installation in an electronic system for cooling one or more components of the system.

BACKGROUND OF THE INVENTION

Design and manufacturing technology for electronic and optical components has advanced and continues to advance in miniaturization, density, function and performance. As a result, today's devices and systems incorporate a large amount of functionality into a small amount of space. Examples of this are laptop computers, servers, switches and other small form factor devices and systems. These systems must be kept from overheating by dissipating heat to the surrounding environment. Some components within the systems must also be given special attention because they generate more heat than the others. Examples of these devices may include microprocessors, optical transceivers, power converters and many other components.

Conventionally, components within a system which generate large amounts of heat are cooled by mounting a heat sink on the components themselves. In this configuration, the heat sink is generally mounted to the device by adhering or clipping it to the device which dissipates heat. The adhering agent is generally thermally conductive and facilitates the flow of heat from the device to the heat sink where the heat is exchanged with the surrounding environment through radiation and convection.

Adhesives and clips, however, are not well suited for mounting heat sinks in a variety of situations. First, electronic components may be packaged in Teflon or nylon packages. Adhesives do not adhere well to Teflon and nylon and therefore the application of adhesive to attach a heat sink to such components does not work well and is unreliable. Similarly, clipping a heat sink to a device may not be stable and, depending on the density of the layout within a system, may not fit.

As an alternative to mounting a heat sink on a device through adhesives or clips, heat sinks have conventionally also been mounted to a substrate such as a printed circuit board, to which the device is attached. In this configuration, standoffs or posts are generally required to support or suspend the heat sink above the substrate. These supports require additional space on the substrate and also generally require through holes in the substrate itself. For this reason, heat sinks generally cannot be added to a preexisting substrate design without redesigning the substrate to accommodate the supports. In addition, for newly designed substrates, the through holes place in the substrate to accommodate the posts block wiring channels within the substrate and therefore may complicate layout of the substrate. In addition, the posts themselves take up valuable space on the substrate that could be used for other purposes.

Accordingly, there is a need for a method and apparatus for mounting a heat sink in an operative relation to an electronic device that overcomes alignment difficulties and is easy to manufacture. There is a further need for a method and apparatus for mounting a heat sink that does not require additional area on a substrate, such as a printed circuit board. There is a further need for a heat sink that does not require adhesives or additional structures such as mounting posts for affixing the heat sink to a substrate.

SUMMARY OF THE INVENTION

According to the present invention, a heat sink is provided that does not require posts, standoffs or adhesives to mount the heat sink to the device to be cooled or the substrate. Rather, the heat sink includes a mounting plate that is secured between the substrate and the component. The mounting plate includes holes to accommodate the leads of the component and mounting flanges that partially surround the component. The mounting flanges are used to mount the heat sink. In the mounted position, the heat sink is held in thermal communication with the component directly or through a thermally conductive material.

According to one embodiment of the present invention, an apparatus for attaching a leaded component to a substrate includes a mounting plate and a heat sink. The mounting plate has at least two mounting flanges and at least one hole through which to pass one or more leads of a component. The heat sink is secured relative to the mounting plate by the mounting flanges. The mounting plate may further include securing flanges for securing the component to the mounting plate. Also, the mounting flanges themselves may be inwardly biased to secure the component to the mounting plate.

The mounting flanges may include holes for accommodating a fastener for fastening to a the heat sink at a lower or an upper surface of the heat sink. When contacting the upper surface of the heat sink, the mounting flanges may downwardly bias the heat sink toward the component. The mounting plate may be electrically insulated or electrically conductive. In the latter configuration, the mounting plate may be coupled to an electrical potential provided by the substrate.

According to another embodiment of the invention, a method of mounting a heat sink includes affixing a mounting plate, having mounting flanges and at least one hole, to a substrate. The method further includes mounting the leads of the component to the substrate through the holes in the mounting plate and fastening a heat sink to the mounting flanges. The mounting step brings the heat sink into thermal contact with the component either directly or through an intermediate thermally conductive material.

BRIEF DESCRIPTION OF THE FIGURES

The above described features and advantages of various embodiments of the invention will be more fully appreciated with reference to the attached drawings and detailed description.

DETAILED DESCRIPTION

According to the present invention, a heat sink is provided that does not require posts, standoffs or adhesives to mount the heat sink to the device to be cooled or the substrate. Rather, the heat sink includes a mounting plate that is secured between the substrate and the component. The mounting plate includes holes to accommodate the leads of the component and mounting flanges that partially surround the component. The mounting flanges are used to mount the heat sink. In the mounted position, the heat sink is held in thermal communication with the component directly or through a thermally conductive material.

Figure 1:
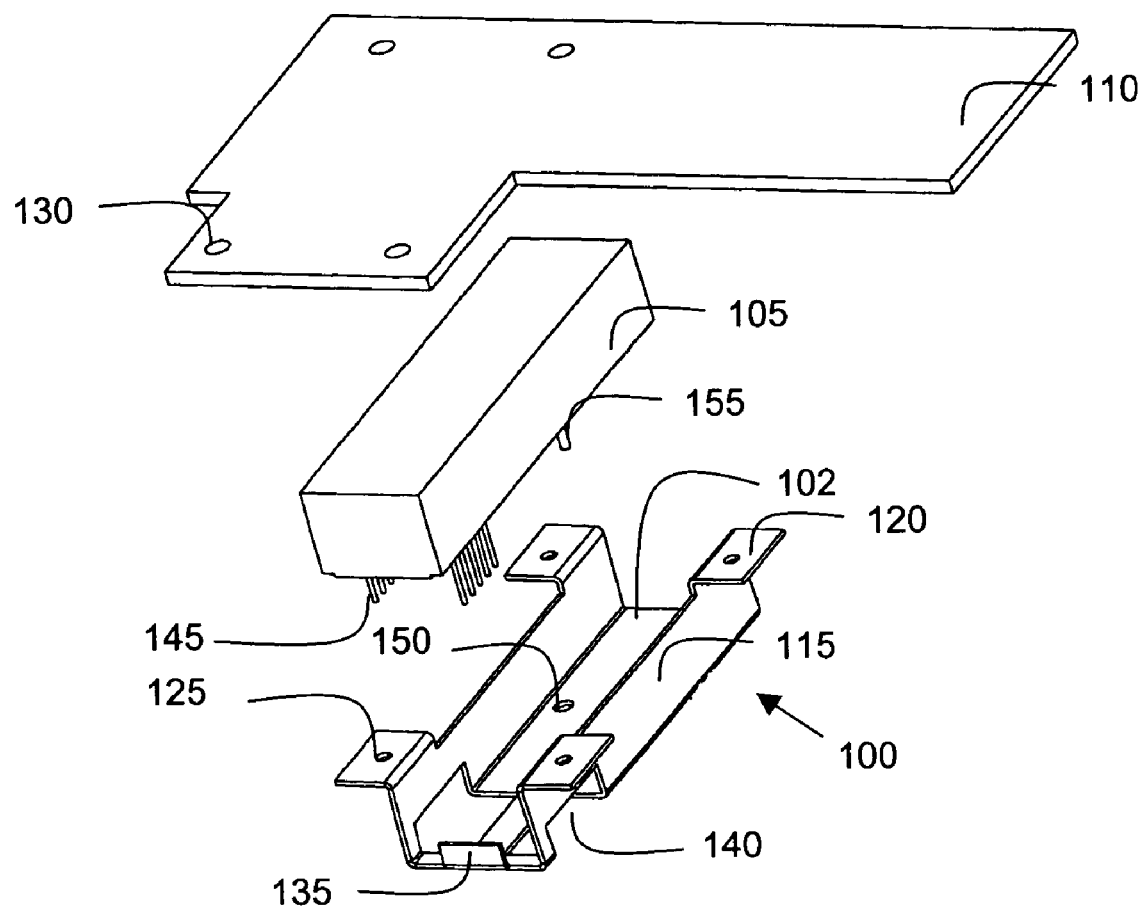
FIG. 1 depicts an exploded view of a component, a mounting plate and a heat sink according to an embodiment of the present invention.

FIG. 1 depicts an exploded view of an illustrative embodiment of the invention that includes a component, a mounting plate and a heat sink. Referring to FIG. 1, the mounting plate 100 includes a base portion 102, mounting flanges 115 and a securing flange 135. As shown, the base portion 102 is situated between two mounting flanges 115. There may be one or more mounting flanges, however, and the base portion does not need to be centered relative to opposing flanges.

The base portion includes one or more holes, such as the holes 140 and 150. The holes are wide enough to accommodate leads 145 or other protrusions 155 of a component 105. The component is situated above the mounting plate relative to a substrate to which the component 105 is electrically connected. When the component 105 is connected to the substrate through the mounting plate, the leads 145 and 155 penetrate the holes of the mounting plate to make electrical connection to the substrate. The holes of the mounting plate, therefore, accommodate components with lead configurations that are compatible with the hole configuration of the mounting plate.

The components may comprise a semiconductor integrated circuit die or chip that is encased within a package. The package conveys electrical signals from the input/output terminals of the chip to the input/output terminals of a larger system or component thereof. There are many different types of packages. A lead frame package is one in which the chip is encapsulated in plastic and its terminals are connected to frame strips which are bent around the periphery of the plastic to form the leads of the package. The leads electrically connect the chip to other components. Other types of packages include pin grid array packages (PGA), dual-in-line metal lead packages or DIPs. These packages, when attached to a substrate such as a printed circuit board, generally require through holes to be made in the substrate to accommodate the leads. Other packages, such as the small outline J-Lead package (SOJ package), do not require plated through holes on a substrate. Rather, the leads makes physical and electrical connection to the surface layer of the substrate. The mounting plate may be used with components that have leads that are connected using through hole or surface mount attachment techniques. In general, the mounting plate may be used with any leaded components.

The mounting flanges 125 of the mounting plate 100 are used to support and fasten to the heat sink 130. This may be facilitated by providing one or more mounting surfaces 120 on the mounting flanges, holes 125 on the mounting flanges and corresponding holes 130 within the heat sink 110. The heat sink 110 may then be fastened to the mounting flanges using a fastener, such as a screw, a bolt, a rivet, a pin or any other member that penetrates the holes in order to hold the heat sink to the mounting plate. Alternatively, the heat sink may be fastened to a mounting surface 120 of the mounting flange through any other convenient fastening technique including using adhesives or clips.

Figure 2:
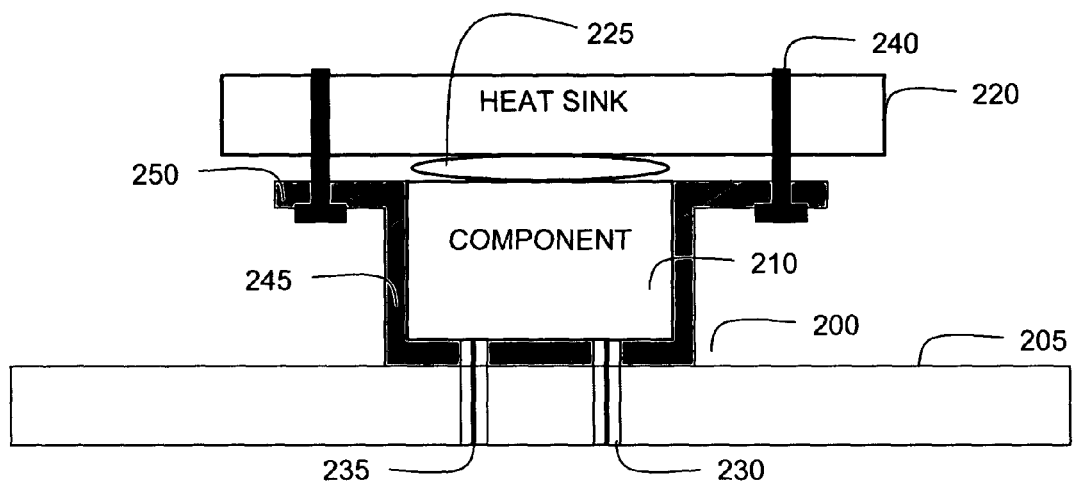
FIG. 2 depicts a cross section of a heat sink mounted on a mounting plate in operative relation to a component according to an embodiment of the present invention.

FIG. 2 depicts a cross sectional view of a heat sink mounted on a mounting plate in operative relation to a component according to an embodiment of the present invention. Referring to FIG. 2, the component 210 is electrically connected to the substrate 205 via leads 230. The mounting plate 200 is positioned intermediate the component 210 and the substrate 205. The substrate 205 may be a printed circuit board, package or any other interconnect and may include holes 235 that accommodate the leads 230 of the component 210. The leads of the component may be soldered within the holes to electrically connect the component to the substrate.

In the depicted embodiment, the mounting plate 200 is fastened to the heat sink via members 240. The fasteners secure the heat sink to the mounting flanges which secures the heat sink and brings a lower surface of the heat sink into thermal communication with an upper surface of the component 225. To facilitate heat removal from the component 210, a thermal interface material 225 may be situated or adhered between the lower surface of the heat sink 220 and the upper surface of the component 210. Depending on the desired profile of the component when mounted, the component may be suspended above the mounting plate 200. Alternatively, the lower surface of the component may be in physical and thermal contact with the mounting plate. Additional paths for heat dissipation may include from the lower surface of the component to the substrate through the mounting plate and from the lower and side surfaces of the component to the heat sink through the mounting plate.

Figure 3:
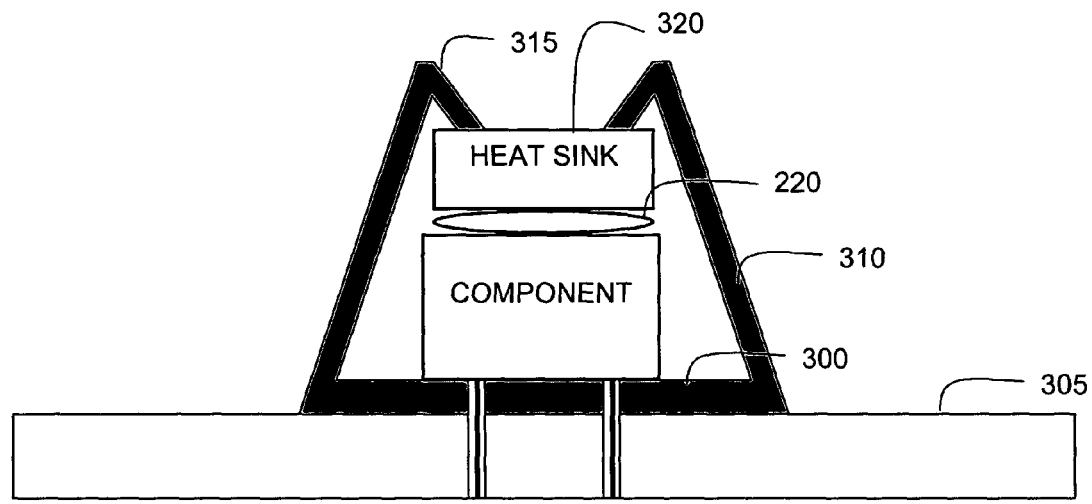
FIG. 3 depicts a cross section of a heat sink mounted on a mounting plate in operative relation to a component according to another embodiment of the present invention.

FIG. 3 depicts a heat sink mounted on a mounting plate in operative relation to a component according to another embodiment of the present invention. Referring to FIG. 3, the mounting plate 300 includes mounting flanges that extend from the substrate up and over the heat sink 320. The mounting flanges may include mounting surfaces 315 that are inwardly biased for positioning on an upper surface of the heat sink 320. The mounting flanges in this configuration urge the heat sink toward the component 325 by virtue of their inward bias and thereby hold the heat sink in place. The mounting surface 315 may include a flat surface for adhering or clipping to the heat sink or a surface with a hole for use in inserting a fastener between the heat sink and the mounting flanges.

Figure 4:
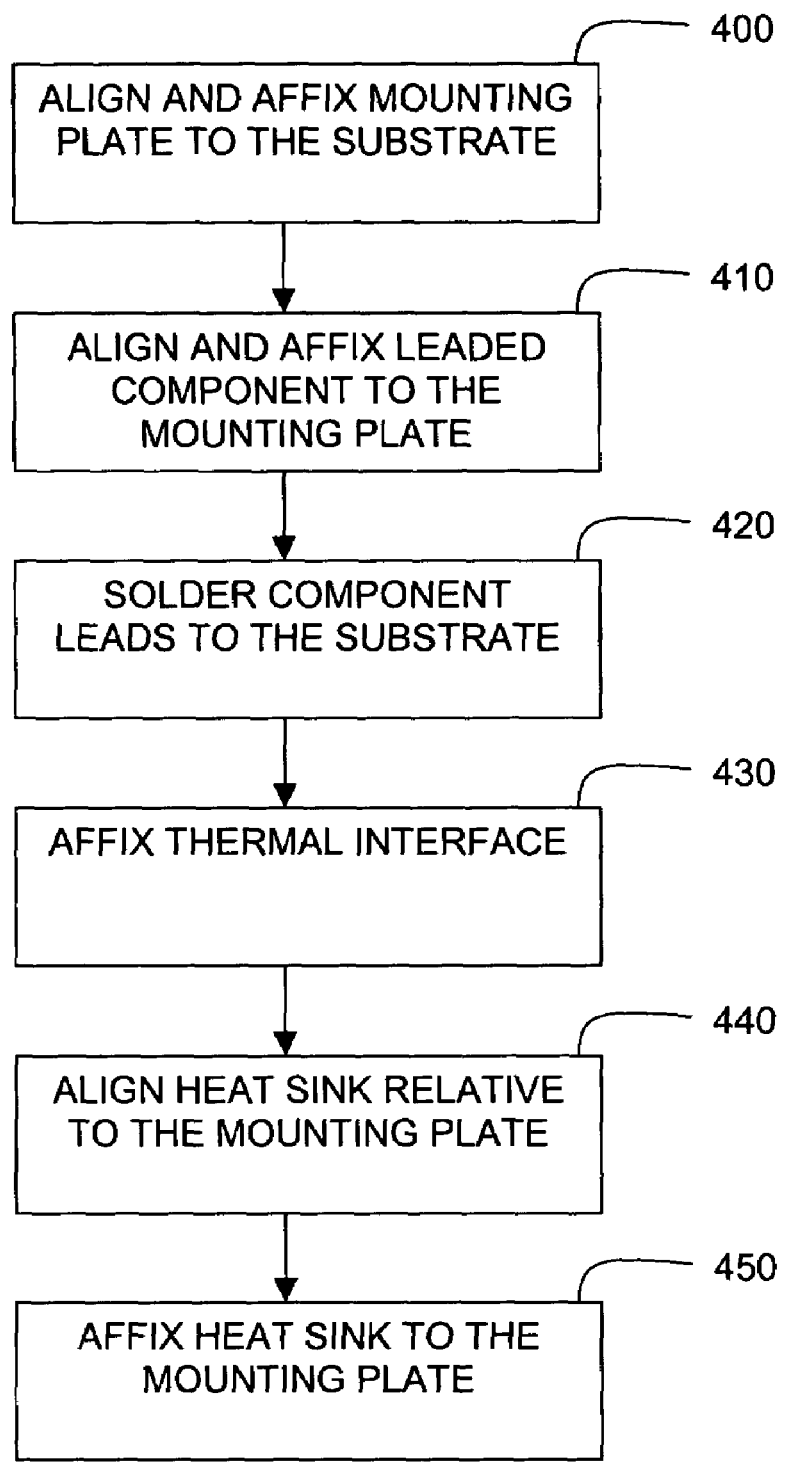
FIG. 4 depicts a method of using a heat sink and mounting plate according to an embodiment of the present invention.

FIG. 4 depicts a method of using a heat sink and mounting plate according to an embodiment of the present invention. Referring to FIG. 4, in step 400, the mounting plate is aligned and affixed to the substrate. This may be done with adhesive or a fastener. In step 410, the leaded component is aligned and affixed to the mounting plate. The lower surface of the component may contact the upper surface of the mounting plate.

In step 420, the component leads are soldered to the substrate. In this step the mounting plate may also be electrically connected to an electrical potential of the substrate. In step 430, the thermal interface (optional) is affixed to the upper surface of the component or to the lower surface of the heat sink. In step 440, the heat sink is aligned relative to the mounting plate. Then in step 450, the heat sink is fastened to the mounting plate and brought into thermal contact with the component directly or through the thermal interface material.

The heat sink itself may be any type of heat sink without restriction, including a plate or a finned heat sink. The mounting plate may be manufactured of any convenient material including metal, plastic, ceramic or other material. According to one embodiment of the invention, the mounting plate is made of aluminum which is stamped to create the base and flange portions and the holes. However, it will be understood that the mounting plate may be made by molding, machining or any other convenient technique.

While particular embodiments of the present invention have been shown and described, it will be understood by those having ordinary skill in the art that changes may be made to those embodiments without departing from the spirit and scope of the invention.

What is claimed is:

1. An apparatus for attaching a leaded component to a substrate, comprising:

a mounting plate having a base portion, a first side wall extending from a first side of the base portion in a first direction, a second side wall extending in the first direction from a second side of the base portion that is axially aligned to the first side of the base portion, and at least one mounting flange perpendicular to, and extending from, the first side wall and away from the base portion and at least one mounting flange perpendicular to, and to extending from, the second side wall and away from the base portion, a securing flange extending from a third side of the base portion in the first direction and at least one hole extending down at least one of the first side wall and second side wall through to the base portion of the mounting plate through which to pass a lead of a component; and a heat sink, separate and distinct from the mounting plate, that is removably secured relative to the mounting plate by the mounting flanges.

2. The apparatus according to claim 1, wherein the mounting flanges secures the component to the mounting plate.

3. The apparatus according to claim 1, wherein the mounting flanges include holes for a fastener.

4. The apparatus according to claim 3, wherein the heat sink includes holes for the fastener to fasten the heat sink to the mounting flanges.

5. The apparatus according to claim 4, wherein the fastener includes one of a screw, a rivet, and a bolt.

6. The apparatus according to claim 1, further comprising a thermal interface material adjoining a lower surface of the heat sink.

7. The apparatus according to claim 6, wherein the lower surface of the base portion of the mounting plate is fastened to a substrate and the heat sink is mounted to the mounting flanges and the lower surface of the heat sink is in thermal communication with an upper surface of the component through the thermal interface material.

8. The apparatus according to claim 7, wherein the side walls and flanges partially surround the component.

9. The apparatus according to claim 7, wherein the mounting plate is electrically insulated.

10. The apparatus according to claim 1, wherein the base portion of the mounting plate includes fewer holes than the number of leads of the component.

11. The apparatus according to claim 1, wherein the component is a through hole mounted component.

* * * * *